(12) United States Patent
Hantschel et al.

(10) Patent No.: US 7,800,388 B2
(45) Date of Patent: Sep. 21, 2010

(54) CURVED SPRING STRUCTURE WITH ELONGATED SECTION LOCATED UNDER CANTILEVERED SECTION

(75) Inventors: Thomas Hantschel, Menlo Park, CA (US); Eugene M. Chow, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 257 days.

(21) Appl. No.: 11/549,066

(22) Filed: Oct. 12, 2006

(65) Prior Publication Data
US 2007/0069751 A1   Mar. 29, 2007

Related U.S. Application Data

(62) Division of application No. 10/971,467, filed on Oct. 21, 2004, now Pat. No. 7,230,440.

(51) Int. Cl.
*G01R 31/02* (2006.01)
(52) U.S. Cl. ........................... 324/762; 324/761
(58) Field of Classification Search .......... 324/750–768, 324/72.5, 158.1, 770; 323/246, 257–258; 333/246–248; 439/480, 482
See application file for complete search history.

(56) References Cited

U.S. PATENT DOCUMENTS

| 3,842,189 | A | 10/1974 | Southgate |
|---|---|---|---|
| 3,952,404 | A | 4/1976 | Matunami |
| 4,189,342 | A | 2/1980 | Kock |
| 4,423,401 | A | 12/1983 | Mueller |
| 4,468,014 | A | 8/1984 | Strong |
| 4,821,148 | A | 4/1989 | Kobayashi et al. |
| 5,280,139 | A | 1/1994 | Suppelsa et al. |

(Continued)

FOREIGN PATENT DOCUMENTS

WO    WO 99/18445 A1    4/1999

(Continued)

OTHER PUBLICATIONS

Zou et al. "Plastic Deformation Magnetic Assembly (PDMA) of Out-of-Plane Microstrutures: Technology and Application," IEEE Journal of Microelectromechanical Systems, vol. 10, No. 2, Jun. 2001, pp. 302-309.

(Continued)

*Primary Examiner*—Minh N Tang
*Assistant Examiner*—Trung Q Nguyen
(74) *Attorney, Agent, or Firm*—Bever, Hoffman & Harms, LLP; Patrick T. Bever

(57) ABSTRACT

A curved spring structure includes a base section extending parallel to the substrate surface, a curved cantilever section bent away from the substrate surface, and an elongated section extending from the base section along the substrate surface under the cantilevered section. The spring structure includes a spring finger formed from a self-bending material film (e.g., stress-engineered metal, bimorph/bimetallic) that is patterned and released. A cladding layer is then electroplated and/or electroless plated onto the spring finger for strength. The elongated section is formed from plating material deposited simultaneously with cladding layers. To promote the formation of the elongated section, a cementation layer is provided under the spring finger to facilitate electroplating, or the substrate surface is pre-treated to facilitate electroless plating.

14 Claims, 12 Drawing Sheets

U.S. PATENT DOCUMENTS

| | | | |
|---|---|---|---|
| 5,399,232 A | 3/1995 | Albrecht et al. | |
| 5,414,298 A | 5/1995 | Grube et al. | |
| 5,465,611 A | 11/1995 | Ruf et al. | |
| 5,513,518 A | 5/1996 | Lindsay | |
| 5,515,719 A | 5/1996 | Lindsay | |
| 5,534,662 A | 7/1996 | Peacock et al. | |
| 5,612,491 A | 3/1997 | Lindsay | |
| 5,613,861 A | 3/1997 | Smith et al. | |
| 5,665,648 A | 9/1997 | Little | |
| 5,780,885 A | 7/1998 | Diem et al. | |
| 5,831,181 A | 11/1998 | Majumdar et al. | |
| 5,848,685 A | 12/1998 | Smith et al. | |
| 5,914,218 A | 6/1999 | Smith et al. | |
| 5,939,623 A | 8/1999 | Muramatsu et al. | |
| 5,944,537 A | 8/1999 | Smith et al. | |
| 5,959,516 A | 9/1999 | Chang et al. | |
| 5,960,147 A | 9/1999 | Muramatsu et al. | |
| 5,979,892 A | 11/1999 | Smith | |
| 6,011,261 A | 1/2000 | Ikeda et al. | |
| 6,117,694 A | 9/2000 | Smith et al. | |
| 6,184,065 B1 | 2/2001 | Smith et al. | |
| 6,184,699 B1 | 2/2001 | Smith et al. | |
| 6,194,774 B1 | 2/2001 | Cheon | |
| 6,213,789 B1 | 4/2001 | Chua et al. | |
| 6,249,039 B1 | 6/2001 | Harvey et al. | |
| 6,252,175 B1 | 6/2001 | Khandros | |
| 6,264,477 B1 | 7/2001 | Smith et al. | |
| 6,290,510 B1 | 9/2001 | Fork et al. | |
| 6,299,462 B1 | 10/2001 | Biegelsen | |
| 6,352,454 B1 | 3/2002 | Kim et al. | |
| 6,392,524 B1 | 5/2002 | Biegelsen et al. | |
| 6,441,359 B1 | 8/2002 | Cozier et al. | |
| 6,455,885 B1 | 9/2002 | Lin | |
| 6,499,216 B1 | 12/2002 | Fjelstad | |
| 6,505,398 B2 | 1/2003 | Park | |
| 6,528,350 B2 | 3/2003 | Fork | |
| 6,528,785 B1 | 3/2003 | Nakayama et al. | |
| 6,556,648 B1 | 4/2003 | Bal et al. | |
| 6,578,410 B1 | 6/2003 | Israelachvili | |
| 6,815,961 B2 | 11/2004 | Mok et al. | |
| 6,956,389 B1 | 10/2005 | Mai | |
| 7,048,548 B2 * | 5/2006 | Mathieu et al. | 439/66 |
| 7,084,656 B1 * | 8/2006 | Khandros et al. | 324/762 |
| 7,200,930 B2 * | 4/2007 | Khandros et al. | 29/860 |
| 2002/0013070 A1 | 1/2002 | Fork et al. | |
| 2002/0040884 A1 | 4/2002 | Hantschel et al. | |
| 2002/0047091 A1 | 4/2002 | Hantschel et al. | |
| 2002/0055282 A1 | 5/2002 | Eldridge et al. | |
| 2002/0079445 A1 | 6/2002 | Hantschel et al. | |
| 2002/0164893 A1 | 11/2002 | Mathieu et al. | |
| 2003/0010615 A1 | 1/2003 | Fork et al. | |
| 2005/0184745 A1 * | 8/2005 | Machida et al. | 324/754 |
| 2006/0105122 A1 | 5/2006 | Hantschel et al. | |

FOREIGN PATENT DOCUMENTS

| | | |
|---|---|---|
| WO | WO 00/33089 A2 | 6/2000 |
| WO | WO 01/48870 A2 | 7/2001 |

OTHER PUBLICATIONS

Chen et al. "Nanostructure patterns written in polycarbonate by a bent optical fiber probe," J. Vac. Sci. Technol. B 19(6), Nov./Dec. 2001, pp. 2299-2300.

Datta, Madhav "Microfabrication by electrochemical metal removal," IBM J. Res. Develop. vol. 42, No. 5, Sep. 1998, pp. 655-669.

Larson, Lawrence E., ed. *RF and Microwave Circuit Design for Wireless Communications*, Artech House: Boston 1997, 8 pgs.

Zhang et al. "A MEMS nanoplotter with high-density parallel dip-pen nanolithography probe arrays," IOP Publishing, Nanotechnology 13 (2002), pp. 212-217.

Craninckx et al. "A CMOS 1.8GHz Low-Phase-Noise-Voltage-Controlled Oscillator with Prescaler," 1995 IEEE International Solid-State Circuits Conference, Digest of Technical Papers, pp. 266-268.

Rogner et al. "The LIGA technique—what are the new opportunities," J. Micromech. Microeng. 2 (1992), pp. 133-140.

Nguyen et al. "Si IC-Compatible Inductors and LC Passive Filters," IEEE Journal of Solid-State Circuits, vol. 25, No. 4, Aug. 1990, pp. 1028-1031.

Chang et al. "Large Suspended Inductors on Silicon and Their Use in a 2-μm CMOS RF Amplifier," IEEE Electron Device Letters, vol. 14, No. 5, May 1993, pp. 246-248.

Nguyen et al, "A 1.8-GHz Monolithic LC Voltage-Controlled Oscillator," IEEE Journal of Solid-State Circuits, vol. 27, No. 3, Mar. 1992, pp. 444-450.

* cited by examiner

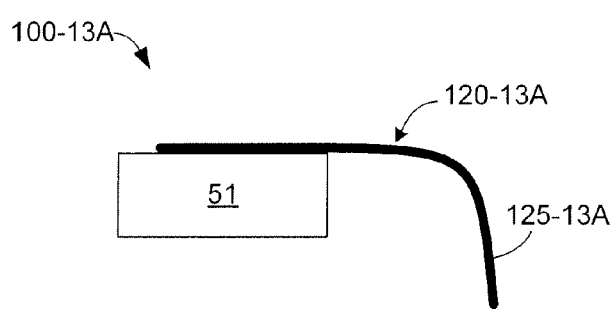
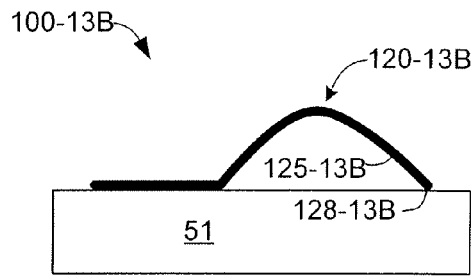
FIG. 13(A) (PRIOR ART)
FIG. 13(B)
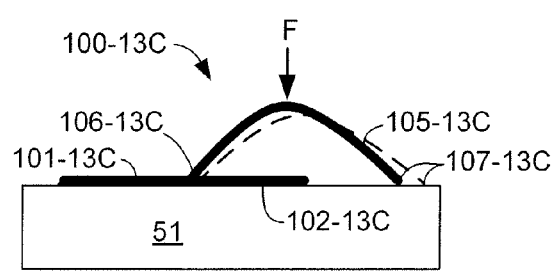
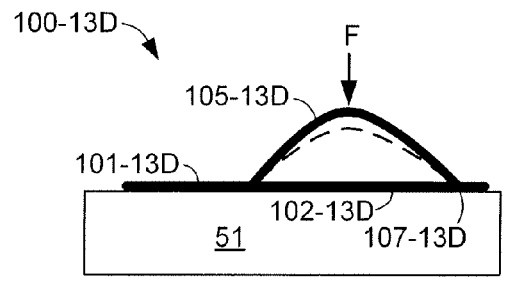
FIG. 13(C)
FIG. 13(D)

US 7,800,388 B2

CURVED SPRING STRUCTURE WITH ELONGATED SECTION LOCATED UNDER CANTILEVERED SECTION

RELATED APPLICATIONS

This application is a divisional of U.S. patent application Ser. No. 10/971,467, entitled "Curved Spring Structure With Elongated Section Located Under Cantilevered Section" filed Oct. 21, 2004.

FIELD OF THE INVENTION

This invention generally relates to curved micro-spring structures formed from self-bending materials that are used, for example, as test probes and interconnect structures for integrated circuits, and more particularly to curved micro-spring structures that are metal plated.

BACKGROUND OF THE INVENTION

Photolithographically patterned self-bending spring structures (e.g., spring probes) have been developed, for example, to produce low cost probe cards and to provide electrical connections between integrated circuits. A typical self-bending spring structure is formed from a stress-engineered (a.k.a. "stressy") metal film that is intentionally fabricated such that its lower/upper portions have a higher internal tensile stress than its upper/lower portions. For example, a spring bending away from a substrate surface has lower tensile stress in the lower portion than in the upper portion, thus producing an upward bend (note that all of the examples provided herein describe this stress gradient). In contrast, a downward bending spring may be produced by providing a higher tensile stress in the lower portion than in the upper portion. The internal stress gradient is produced in the stress-engineered metal film by layering different metals having the desired stress characteristics, or using a single metal by altering the fabrication parameters during deposition. The stress-engineered metal film is patterned to form islands that are secured to an underlying substrate either directly or using an intermediate release material layer. When the release material (and/or underlying substrate) is selectively etched from beneath a first (free) portion, the free portion bends away from the substrate to relieve the internal stress, thereby producing a spring structure that remains secured to the substrate by an anchor portion, but has a bent "free" (cantilevered) portion that extends away from the substrate surface. The tip of the cantilevered portion may then be contacted with selected pads on an integrated circuit, or curvature of the spring structure may be controlled to form a loop or other desired shape. In this manner, such spring structure may be used in probe cards, for electrically bonding integrated circuits, circuit boards, and electrode arrays, and for producing other devices such as inductors, variable capacitors, and actuated mirrors. Examples of such spring structures are disclosed in U.S. Pat. No. 3,842,189 (Southgate) and U.S. Pat. No. 5,613,861 (Smith).

When used to form probe cards, such spring metal structures must exhibit sufficient stiffness to facilitate proper electrical connection between the probe (spring metal finger) and a corresponding contact pad on the device-under-test. Most stressy metal spring probes produced by conventional methods are fabricated from sputtered or plated metal that is approximately one micron thick, which produces only a nominal stiffness capable of resisting a force of 0.1 to 0.2 grams (gmf). These stressy metal spring probes may provide sufficient stiffness to probe gold contact pads, but are not stiff enough to reliably probe aluminum pads. Gold pads can be readily probed with relatively weak spring probes because gold does not form a passivation layer that takes significant force to puncture. However, aluminum pads form a passivation layer that must be punctured by the tip of the spring probe in order to facilitate proper electrical connection. To repeatedly achieve electrical contact to aluminum, which is required for many integrated circuit probe card applications, deflection of the probes within their elastic region should absorb an expected force of at least a few grams.

One method of increasing the stiffness of stressy metal spring structures is to increase its thickness by producing thicker stressy metal films. However, the release height of a spring structure is proportional to its stress gradient divided by the stressy metal film thickness. This means that, by making the stressy metal film thicker, the release height is reduced. Of course, one can compensate for this reduced release height by increasing the stress gradient, but there are practical limits to how much stress can be induced, and the induced stress often cannot be increased enough to compensate for a very thick stressy metal film. Therefore, the (thin) stressy metal film thickness itself is mostly used to tune for a desired release height.

A more desirable approach to generating spring structures having a higher stiffness is to form and release a relatively thin stressy metal structure, and then thickening the structure using a plating process. Most uses for spring structures today utilize plating (a.k.a., "cladding") of the released springs for improving various spring characteristics such as electrical conductivity, hardness and wear resistance. Plating a thick metal layer (a few microns) on the stress metal film significantly increases probe stiffness, but could also decrease the maximum deflection. Maximum deflection is determined by the initial lift height and the fracture limit of the structure. Laboratory experiments have shown thick electroplated stiffened springs break or yield when deflected a significant fraction of their initial lift height. Failure typically occurs at the base (anchor portion) of the cantilevers, where plating formed either on the bottom surface of the release spring or spontaneously plated onto the underlying substrate surface forms a wedge that acts as a stress-concentrating fulcrum to pry the base away from the underlying substrate as the structure is deflected, resulting in "delamination" of the spring structure. This is currently a serious issue for the reliability of stressed-metal interconnects. Thermocycling results have shown that the current spring structure is very sensitive to delamination. This wedge limits the maximum force of the resulting spring structure because it limits both the allowed thickness of the plating and the maximum displacement.

Another problem associated with plating conventional spring structures is the formation of "resist-edge" plating that is often undesirably deposited around the springs close to the resist mask that defines the release window. A resist-reflow step (e.g. resist annealing, acetone reflow) is often used to avoid the resist-edge plating, but the reflow step does not always reliably prevent the formation of resist-edge plating, and it is also difficult to implement in production.

Accordingly, what is needed is a cost effective method for fabricating spring probes and other spring structures from self-bending spring materials that are thick (stiff) enough to support, for example, large probing forces, but avoid the delamination associated with conventional plated spring structures. What is also needed is a cost effective method for fabricating probes and other spring structures that reliably prevents the formation of resist-edge plating.

SUMMARY OF THE INVENTION

The present invention is directed to plated spring structures that avoid the problems associated with conventional spring structures by including, in addition to the base (anchor) section and curved cantilever section typically associated with conventional spring structures, an elongated section that extends from the base section under the cantilevered section. This elongated section increases the effective area of the spring structure base and precludes the formation of wedge structures and spontaneous plating depositions that serve as undesirable fulcrums to delaminate conventional spring structures, and also eliminates the need for resist-reflow operations used to prevent resist-edge plating in conventional spring structures.

In accordance with an embodiment of the present invention, the elongated section is formed at least in part from plated material that is deposited at the same time as cladding layers are plated onto a released spring finger. The spring finger is formed, for example, from a suitable self-bending spring metal film (e.g., stress-engineered metal, or a bimorph/bimetallic material) that is "released" using known techniques such that a fixed end (the "base" or "anchor portion") of the spring finger remains attached to the underlying substrate, and the curved free end (the "cantilevered section") bends relative to (e.g., away from) the surface of the substrate. During subsequent plating of the spring finger, in addition to plating portions formed on the fixed and free portions of the spring finger, plating material is intentionally formed directly under the released spring finger to form (or enhance) the elongated section. That is, unlike conventional spring structures in which the formation of plating material under the spring finger is avoided, a spring structure formed in accordance with the present invention includes a plating portion that is intentionally formed in the elongated section (i.e., under the raised cantilevered section). This elongated section increases the mechanical strength of the spring structure because it serves to "cement" (secure) the base (anchor portion) of the spring finger to the underlying substrate. In particular, the elongated "cementation" section in effect 1) makes a strong anchor and 2) prevents the thickness of the spring near the base from getting too thick. When there were wedge problems (no cementation used), the inventors would get the fulcrum effect as well as a thicker base of the spring—thicker than intended—so it would have higher stresses when compressed and fracture more readily. Further, the elongated section provides enhanced resistance to delamination by precluding the formation of undesirable wedge structures and/or the spontaneous formation of deposited metal (i.e., because the space otherwise utilized by such delaminating structures is purposefully filled with the plating materials associated with the elongated section). For similar reasons, the cementation section avoids the formation of resist-edge plating structures. The elongated section also serves to decrease the electrical resistance of the compressed spring by providing a larger conducting volume.

In accordance with another embodiment of the present invention, the substrate surface under the cantilevered section is pre-treated and/or a seed ("cementation") layer is provided to promote the formation of the plating material associated with the elongated section. In one specific embodiment, the seed layer is formed under the self-bending film used to form the spring finger, and is exposed when the spring finger is released. This seed layer is then utilized during an electroplating process to form the elongated section. In the second specific embodiment, the substrate surface below the release spring finger is treated to activate the area below the cantilevered spring for eletroless plating of a metal layer, which may then be used during further electroless plating or electroplating to produce the elongated section.

According to another aspect of the present invention, the elongated section is used to connect its corresponding spring structure directly to associated trace metal areas formed on the substrate, or by way of via structures extending through insulating layers or the substrate itself, thereby reducing the effective width and increasing the packing density of the spring structures.

In accordance with another aspect of the present invention, the base section of a spring structure is formed with a width that is substantially wider than that of the cantilever section, and in some instances wider than the width of the elongated section. An advantage to the wide base section is that the spring structure may be fabricated using a highly efficient fabrication process that obviates the need for masking the anchor portion of the spring finger during release, and allows the use of lithography masks that are designed in such a way that no extra mask is needed for spring cementation (i.e., post release plating).

In accordance with yet another embodiment, the elongated section is used as a back-side exposure mask to pattern material formed on the spring tip.

BRIEF DESCRIPTION OF THE DRAWINGS

These and other features, aspects and advantages of the present invention will become better understood with regard to the following description, appended claims, and accompanying drawings, where:

FIG. 13(A) is a simplified side view showing a conventional downward bending spring structure; and FIGS. 13(B), 13(C) and 13(D) are simplified side views showing downward bending spring structures according to additional embodiments of the present invention.

DETAILED DESCRIPTION OF THE DRAWINGS

Figure 1:
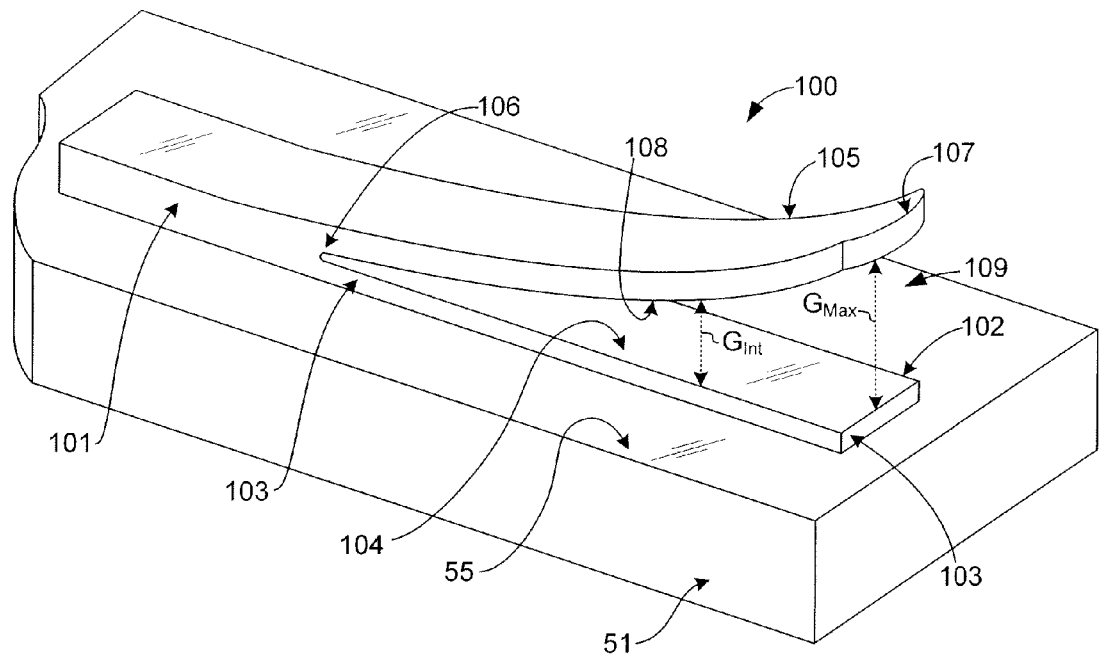
FIG. 1 is a perspective view of a spring structure according to an embodiment of the present invention.

FIG. 1 is a perspective view showing a spring structure 100 according to an embodiment of the present invention. Spring structure 100 is formed on an upper surface 55 of a host substrate (e.g., a glass, quartz, silicon, ceramic or flexible substrate) 51. The term "substrate" also includes any flexible or rigid substrate upon which integrated circuits have been fabricated (e.g., a silicon wafer from an integrated circuit foundry would have many transistors fabricated on the substrate, on this substrate the spring structure could be fabricated). Spring structure 100 generally includes a base section 101, an elongated section 102, and a curved cantilever section 105. Base section 101 is attached to surface 55 (or to an optional intervening layer-not shown), and extends to a junction point 106. Elongated section 102 has a first end attached to base section 101 at junction point 106, and extends away from base section 101 in a direction parallel to surface 55 to a free end 103. Curved cantilever section 105 has a fixed end attached to base structure 101 at junction point 106, and gradually curves away from base structure 101 to a tip (free end) 107 such that an angled air gap 109 is defined between an upper surface 104 of elongated section 102 and a lower surface 108 of curved cantilever section 105. The phrase "angled air gap" in this context means that air gap 109 has relatively small intermediate value $G_{Int}$ adjacent to junction point 106 and base section 101, and a relatively large value $G_{Max}$ adjacent to free end 107.

Figure 2:
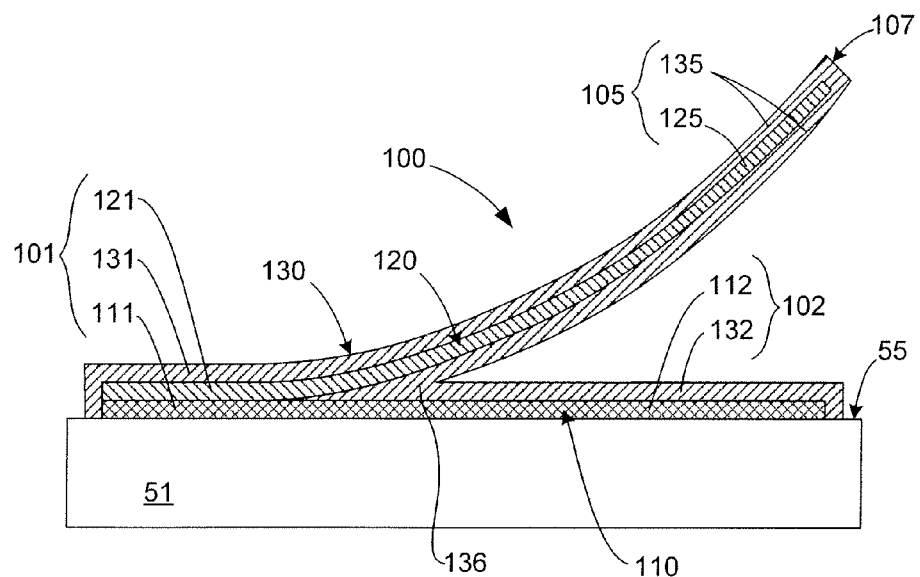
FIG. 2 is a cut-away perspective view of a spring structure according to a specific embodiment of the present invention

FIG. 2 is a cross-sectional side view showing spring structure 100 in additional detail. Spring structure 100 includes an optional cementation layer 110 formed on upper surface 55 (or on an intermediate layer, not shown, that is formed between upper surface 55 and cementation layer 110), a spring finger 120 formed over cementation layer 110 (or an intervening layer formed between cementation layer 110 and spring finger 120), and a cladding layer (plated metal structure) 130 formed on cementation layer 110 and spring finger 120.

Optional cementation layer 110 includes a first end portion 111 located in base section 101, and a second end portion 112 located in elongated section 102, and is entirely formed on or over surface 55. In one embodiment, cementation layer 110 is a suitable plating seed layer (e.g., gold (Au)) that is formed on a region of substrate 55 for purposes of promoting the formation of cladding layer 130 by electoplating. Cementation layer 110 may also be selected from materials suitable for promoting the formation of cladding layer 130 by electroless plating, and may be omitted entirely in some embodiments.

Spring finger 120 includes an anchor portion 121 located in base section 101, and a curved free portion 125 that extends from anchor portion 121 and is located in curved cantilever section 105. According to an aspect of the present invention, spring finger 120 is fabricated using one or more self-bending spring metals (e.g., stress-engineered metals or bimorph/bimetallic compositions) that facilitate selective and controllable bending of the spring structure. The phrase "self-bending spring metal" is defined herein as a metal film having a non-zero internal mechanical stress gradient when formed or subsequently annealed that causes the metal film to bend (curl) away from the substrate after release. The term "stress-engineered metal" or "stressy metal" is defined herein as a sputtered or plated metal film either including a non-zero internal stress gradient, or an intermetallic metal film formed in accordance with co-owned and co-pending U.S. patent application Ser. No. 10/912,418, entitled "Intermetallic Spring Structure", which is incorporated herein by reference. Spring metals may include non-metal components.

Cladding layer 130 is a plated metal layer formed over spring finger 120 and optional cementation layer 110, and includes a base (first) plating portion 131 formed over base section 101, an extended (second) plating portion 132 formed over elongated section 102, and a cantilevered (third) plating portion 135 formed over cantilever section 105. Note that extended plating portion 132 is integrally joined to base plating portion 131 and cantilevered plating portion 135 at a junction region 136, and extends from base plating portion 131 under cantilevered plating portion 135. Cladding layer 130 is formed using known plating techniques (e.g., electroplating and/or electroless plating), and is at least partially formed using one or more metals (e.g., one or more of copper (Cu), nickel (Ni), rhodium (Rh), palladium (Pd), cobalt (Co), chromium (Cr), silver (Ag), zinc (Zn), iron (Fe), cadmium (Cd) and gold (Au)).

Spring structure 100 is distinguished over conventional spring structures in the purposeful formation of elongated section 102 by plating material that is deposited during the formation of cladding layer 130. That is, conventional spring structure fabrication processes typically involve plating the cantilevered and/or base section, but take precautions to avoid the formation of plated metal under the cantilevered section for reasons discussed above (i.e., the formation of "wedge" structures greatly increase the likelihood of delamination). According to an aspect of the present invention, the formation of plated metal under the cantilevered section is not only tolerated, it is in fact stimulated such that extended plating portion 132 is formed under cantilevered plating portion 135. The resulting plating structure formed by base plating portion 131 and extended plating portion 132 serves to 'cement' anchor portion 121 of spring finger 120 to substrate 51, which provides spring structure 100 with a significantly greater adhesive strength over conventional spring structures. In effect, elongated section 102 enlarges the base section 101 such that the point at which cantilevered section 105 separates from the underlying structure (i.e., junction point 106) is shifted to the right (with reference to FIG. 1). Further, elongated section 102 provides enhanced resistance to delamination by precluding the formation of undesirable wedge structures and/or the spontaneous formation of deposited metal (i.e., because the space otherwise utilized by such delaminating structures is purposefully filled with elongated plating portion 132). Thus, compared to conventional spring structures, spring structure 100 exhibits superior resistance to delamination.

As indicated above, elongated section 102 is substantially formed by elongated plating portion 132, which is formed at least partially by plating material that is deposited simultaneously with base plating portion 131 and cantilevered plating portion 135. As set forth in the following exemplary embodiments, the formation of elongated plating portion 132 is stimulated either by providing cementation layer 110 prior to depositing the self-bending film used to form spring finger 120, or by treating the portion of substrate surface 55 located below curved free portion 125 before the plating process.

Figure 3A:
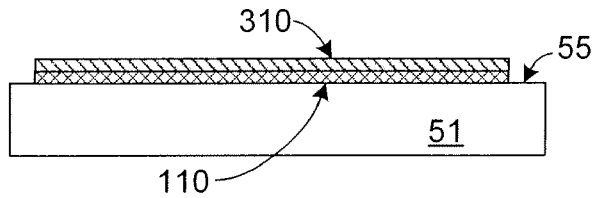
FIGS. 3(A), 3(B) and 3(C) are cross-sectional side views showing simplified fabrication steps associated with the production of the spring structure shown in FIG. 1 according to an embodiment of the present invention.
Figure 3B:
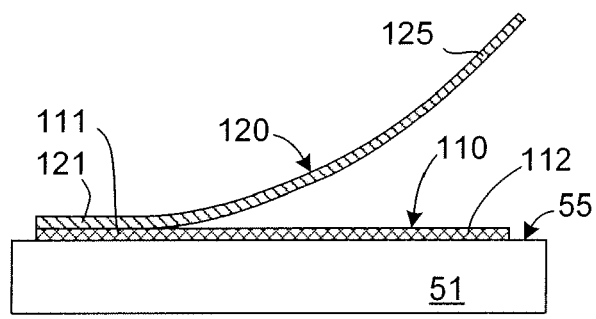
Figure 3C:
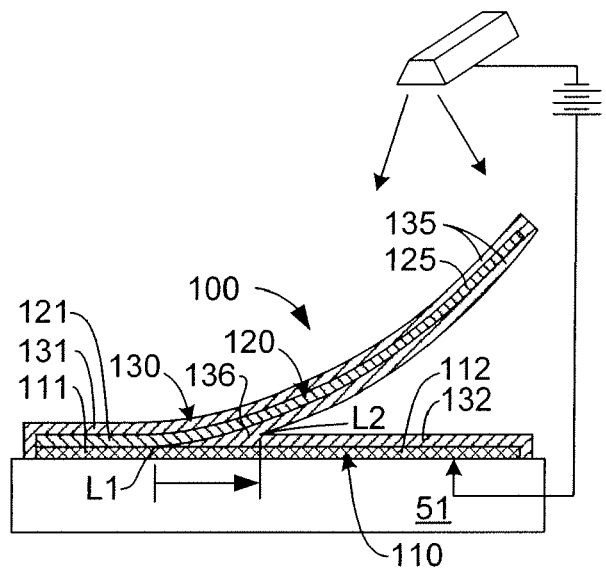

FIGS. 3(A), 3(B), and 3(C) depict a fabrication process for producing spring structure 100 according to an embodiment of the present invention in which cementation layer 110 is utilized.

As shown in FIG. 3(A), fabrication begins by sequentially forming and/or patterning optional cementation layer 110 and a spring material island 310 using known lithographic techniques. In one embodiment, cementation layer 110 includes gold (Au) or another suitable seed material (e.g., nickel (Ni) and/or copper (Cu)) deposited to a suitable thickness (e.g., 10-100 nm). Spring material island 310 is formed using a selected self-bending spring metal and, although not shown, one or more intermediate layers (e.g., a sacrificial "release" layer) may be formed between cementation layer 110 and spring material island 310.

In one embodiment, the self-bending spring metal used to form spring material island 310 is a stress-engineered film in which its lowermost portions (i.e., the deposited material adjacent to cementation layer 110) has a lower internal tensile stress than its upper portions (i.e., the horizontal layers located furthest from cementation layer 110), thereby causing the stress-engineered metal film to have internal stress variations that cause a spring metal finger to bend upward away from substrate 51 during the subsequent release process. Methods for generating such internal stress variations in stress-engineered metal films are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, which utilizes a 0.05-0.2 micron titanium (Ti) release material layer, a stress-engineered metal film includes one or more of molybdenum (Mo), a "moly-chrome" alloy (MoCr), tungsten (W), a titanium-tungsten alloy (Ti:W), chromium (Cr), copper (Cu), nickel (Ni) and a nickel-zirconium alloy (NiZr) that are either sputter deposited or plated over the release material in the manner described above to a thickness of 0.3-2.0 micron. An optional passivation metal layer (not shown; e.g., gold (Au), platinum (Pt), palladium (Pd), or rhodium (Rh)) may be deposited on the upper surface of the stress-engineered metal film to act as a seed material for the subsequent plating process if the stress-engineered metal film does not serve as a good base metal. The passivation metal layer may also be provided to improve contact resistance in the completed spring structure. In an alternative embodiment, a nickel (Ni), copper (Cu) or nickel-zirconium (NiZr) film may be formed that can be directly plated without a seed layer. If electroless plating is used, the deposition of the electrode layer can be skipped.

In an alternative embodiment, the self-bending spring material used to form spring island 310 may be one or more of a bimorph/bimetallic compound (e.g., metal1/metal2, silicon/metal, silicon oxide/metal, silicon/silicon nitride) that are fabricated according to known techniques.

As indicated in FIG. 3(B), the fabrication process includes releasing (actuating) the self-bending spring metal of the spring metal island to form spring finger 120. When the self-bending spring metal used to form spring finger 120 is a stress-engineered metal film, the releasing process may involve, for example, masking anchor portion 121, and then under-etching the exposed free portion 125, thereby releasing (separating) free portion 125 from the underlying substrate 51. Upon release, free portion 125 bends into a curved shape in a manner that relieves its internal stress gradient (note that this stress gradient is retained in the anchor portion). Note that anchor portion 121 remains fixed to substrate 51 by way of an intervening section of the release material layer (when used, not shown) and/or section 111 of optional cementation layer 110 (when used). Note also that the release process is performed such that portion 112 of cementation layer 110 is exposed under free portion 125 of spring finger 120 after the release process is completed. Alternatively, or in addition, the releasing process may involve heating/annealing free portion 125 at a suitable temperature until the desired curvature is achieved. For example, when the self-bending spring metal includes a bimorph/bimetallic compound, the release process may be entirely performed by annealing, or may be released by selective delamination (the stress-gradient in the spring overcomes the adhesion to the underlying substrate surface). Alternatively, when plated stress-engineered films are used, the release process may include both under-etching and annealing. Accordingly, the present invention is not limited to a particular process and/or self-bending material utilized to produce spring finger 120 unless otherwise specified in the appended claims.

Finally, as depicted in FIG. 3(C), plating structure 130 is electroplated or electroless plated over spring finger 120 and portion 112 of cementation layer 110, thereby completing the production of spring structure 100. Note that as the electroplating process proceeds, a junction plating portion 136 is formed, for example, in the V-shaped region defining the point of separation of spring finger 120 (i.e., under free portion 125 adjacent to anchor portion 121). As indicated in FIG. 3(C), plating portion 136 increases the size of the spring structure base by shifting the point of separation from an original location L1 (i.e., where spring finger 120 separates from cementation layer 110) to location L2 (i.e., where cantilevered plating portion 135 separates from elongated plating portion 131). Note also that the effective point of separation (at location L2) is shifted upward from the plane separating anchor portion 121 and portion 111 of cementation layer 110 by the thickness of elongated plating portion 131. In this manner, anchor portion 121 of spring finger 120 is securely cemented (i.e., embedded in and/or surrounded by plating material) to underlying substrate 51.

Figure 4A:
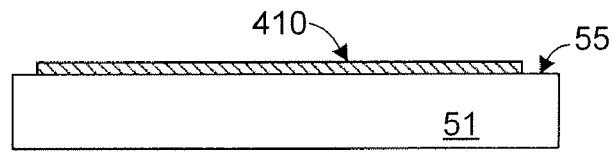
FIGS. 4(A), 4(B) and 4(C) are cross-sectional side views showing simplified fabrication steps associated with the production of the spring structure shown in FIG. 1 according to another embodiment of the present invention.
Figure 4B:
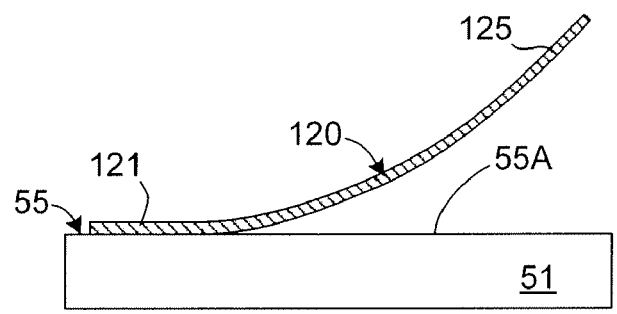
Figure 4C:
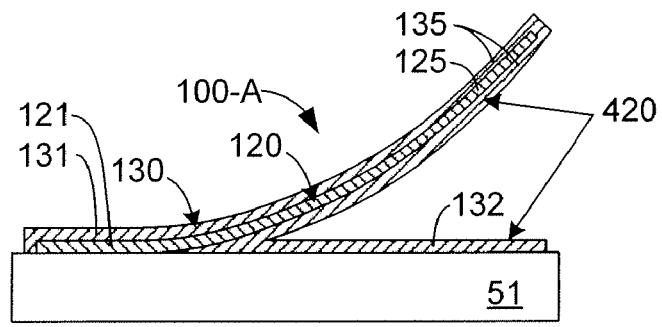

FIGS. 4(A), 4(B), and 4(C) depict a fabrication process for producing spring structure 100 according to another embodiment of the present invention in which a cementation layer is not utilized. In this case, the cementation area (i.e., the substrate surface on which the elongated section is formed) might also be non-conductive (e.g., benzo cyclo butene (BCB), polyimide, oxide, nitride). The present inventors observed in experiments that such a non-conductive surface can be metallized using electroless plating, and that this can be done at the same time as the spring is overplated using the process shown in FIGS. 4(A) to 4(C). As depicted in FIG. 4(A), a spring metal island 410 is formed over surface 55 of substrate using any of the above-mentioned self-bending spring metal (e.g., stress-engineered metal, bimorph/bimetallic) films. As indicated, in FIG. 4(B), the spring island is then released using the methods described above to produce spring finger 120. Subsequent to release, with the release mask still in place, a cementation area 55A of substrate 51 (i.e., the area that is located under free portion 125 of spring finger 120) is pre-treated using, for example, a solution of stannous chloride and/or palladium chloride to activate the non-conductive substrate material for electroless plating. As indicated in FIG. 4(C), electroless plating of a selected plating material 420 (e.g., NiP or NiB) is then used to deposit metal on both spring finger 120 and cementation area 55A. The plating process can then either be continued with electroless plating or electroplating to finish plating portions 131, 132 and 135 of plating structure 130. Note that this spring cementation process is especially attractive because it can be performed without requiring any additional lithography steps and masks. This means that spring cementation can be added to existing spring technologies (e.g. stressed-metal, bimorph/bimetallic) simply by adding the electroless plating step described above, and once a thin conducting layer has been obtained, electroplating can be used to achieve the desired plating thickness.

FIGS. 5(A), 5(B), 6(A) and 6(B) illustrate various optional features associated with spring structures formed in accordance with the present invention.

Figure 5A:
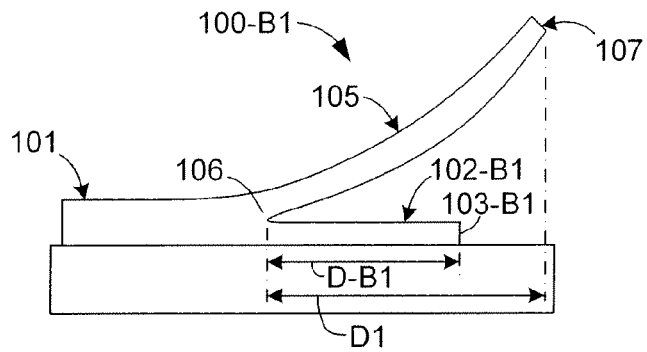
FIGS. 5(A) and 5(B) are side views showing spring structures according to alternative embodiments of the invention.
Figure 5B:
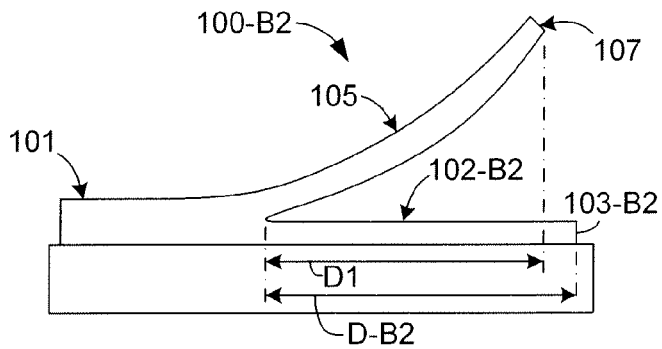

FIGS. 5(A) and 5(B) indicate that the length of the elongated section relative to the length of the cantilevered section may be varied. That is, in addition to being substantially equal in length to cantilevered section 105 (e.g., as indicated in FIG. 1), elongated section 102 may be shorter or longer than cantilevered section 105. For example, as indicated in FIG. 5(A), spring structure 100-B1 includes a curved cantilever section 105 having a tip 107 that is located a distance D1 from base section 101 (e.g., from junction point 106), and an elongated section 102-B1 having an end 103-B1 that is located a distance D-B1 from base section 101, where distance D-B1 is less than distance D1. Advantages of providing the relatively short elongated section 102-B1 are discussed below. Conversely, as indicated in FIG. 5(B), spring structure 100-B2 includes curved cantilever section 105, the length D1, and an elongated section 102-B2 having an end 103-B2 that is located a distance D-B2 from base section 101, where distance D-B2 is greater than distance D1. The length of elongated section 102-B2 may be adjusted in this manner, for example, to provide connection to other structures formed on the substrate.

Figure 6A:
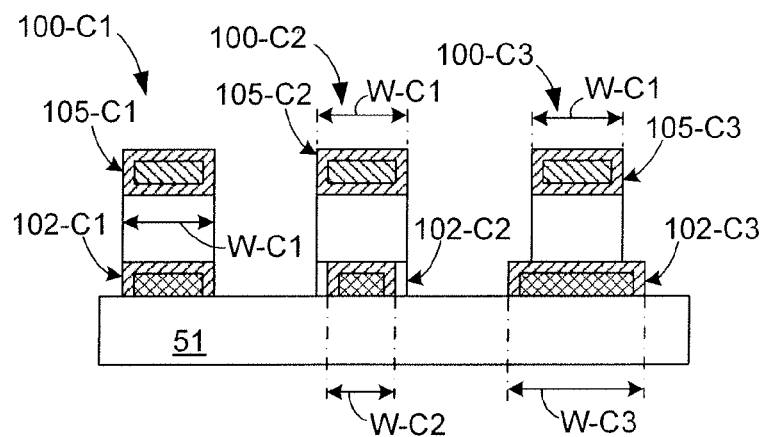
FIGS. 6(A) and 6(B) are cross-sectional end views showing spring structures according to alternative embodiments of the invention.
Figure 6B:
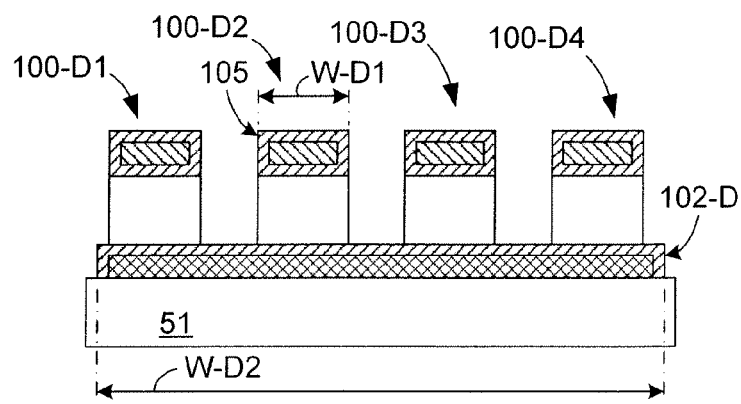

FIGS. 6(A) and 6(B) indicate that the width of the elongated section relative to the width of the cantilevered section may also be varied, and may cover two or more spring structures. As indicated in FIG. 6(A), both elongated section 102-C1 and cantilevered section 105-C1 of spring structure 100-C1 have substantially (i.e., within 10%) the same width W-C1. In contrast, spring structure 100-C2 includes a cantilevered section 105-C2 having width W-C1 and an elongated section 102-C2 having a width W-C2 that is smaller than width W-C1, and spring structure 100-C3 includes a cantilevered section 105-C3 having width W-C1 and an elongated section 102-C3 having a width W-C3 that is substantially greater than width W-C1. Finally, as indicated in FIG. 6(B), several spring structures 100-D1 to 100-D4 may include corresponding cantilevered sections 105-D1 to 105-D4, each having a width W-D1, and a single elongated section 102-D having a width W-D2 that spans all four spring structures.

Figure 7A:
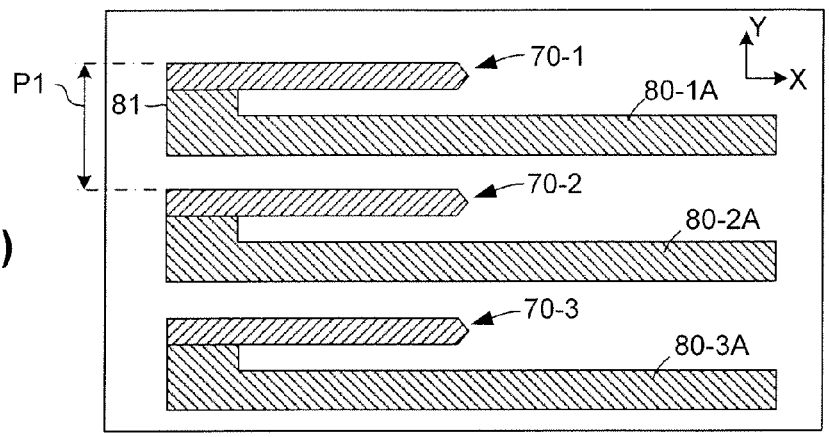
FIGS. 7(A) and 7(B) are top plan view showing a conventional spring structure arrangement and a spring structure arrangement according to another embodiment of the present invention, respectively.
Figure 7B:
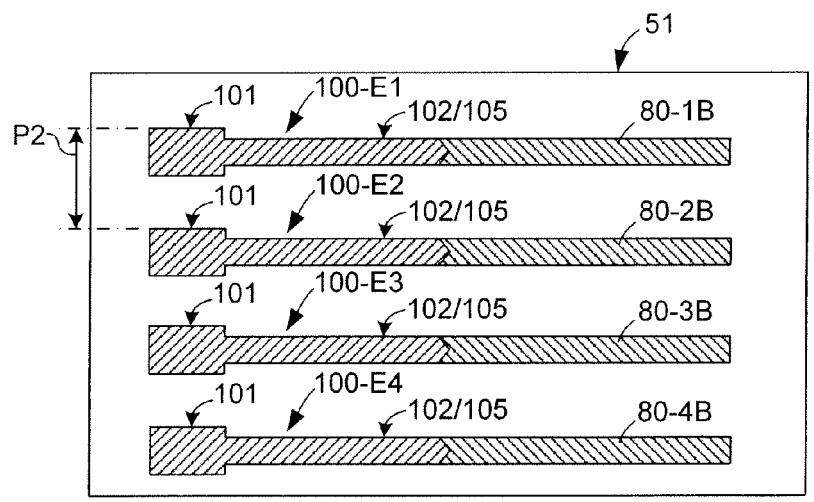

Another advantage associated with the present invention is that the elongated section may be used to connect the corresponding spring structure to associated trace metal areas formed on the substrate, thereby reducing the effective width and increasing the packing density of the spring structures. As indicated in FIG. 7(A), in order to connect conventional springs 70-1 to 70-3, which are aligned in parallel in an X-direction, to corresponding trace areas 80-1A to 80-3A, which are also aligned in the X-direction, short trace segments 81 extending in the Y-direction (i.e., away from the associated spring structure) must be used, thereby resulting in a relatively wide spring structure pitch P1. In contrast, as indicated in FIG. 7(B), by utilizing elongated sections 102 (which are located under corresponding cantilevered sections 105), and in particular relatively long elongated sections such as those shown in FIG. 5(B), to connect spring structures 100-E1 to 100-E4 to co-linear trace areas 80-1B to 80-4B, a relatively narrow spring structure pitch P2 is enabled that increases the spring structure packaging density.

Figure 8A:
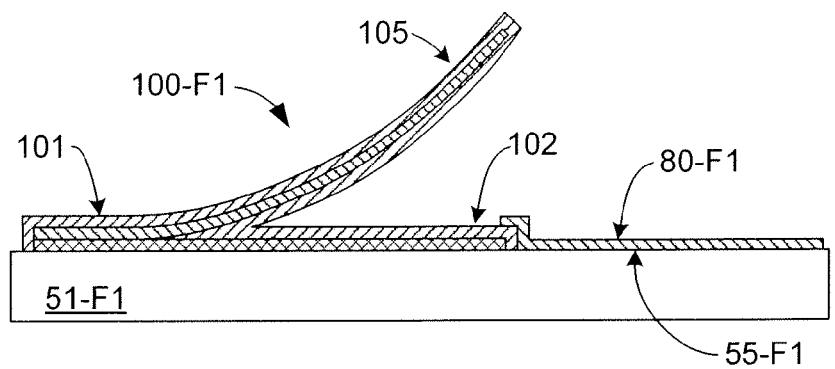
FIGS. 8(A), 8(B) and 8(C) are cross-sectional side views showing alternative connection structures associated with the spring structure shown in FIG. 7(B)
Figure 8B:
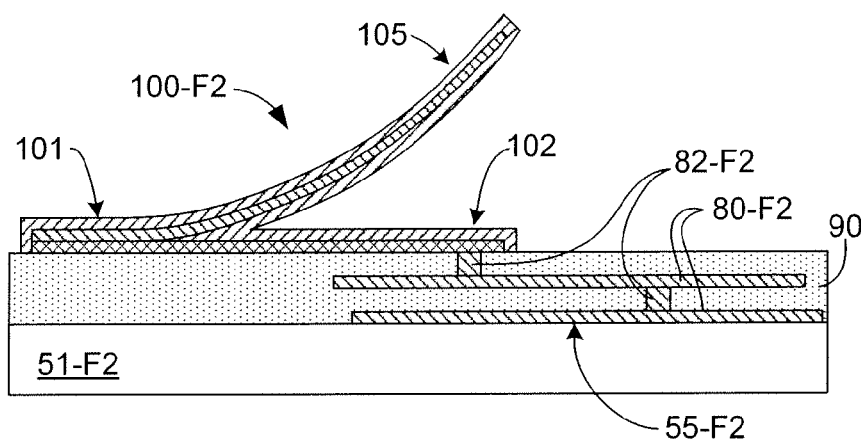
Figure 8C:
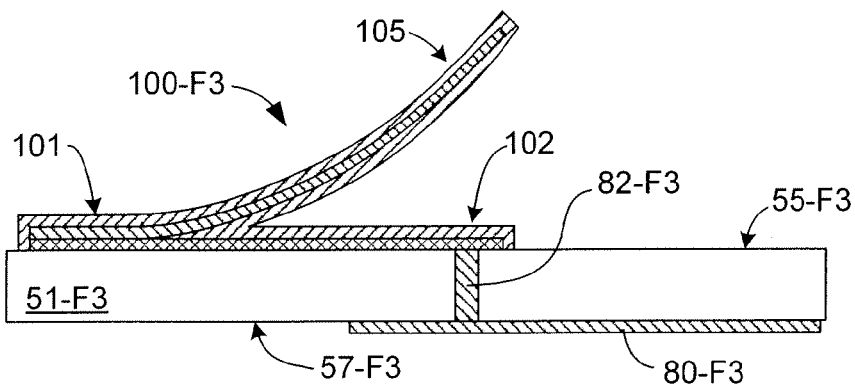

FIGS. 8(A) through 8(C) show various trace metal connection arrangements that are facilitated by spring structures formed according to the present invention. FIG. 8(A) shows a simple arrangement in which a trace structure 80-F1 is formed on or over surface 55-F1 of a substrate 51-F1, and contacts elongated section 102 of spring structure 100-F1, which is formed as described above. FIG. 8(B) shows a second arrangement in which one or more trace structures 80-F2 are embedded in an insulating layer 90, which is formed on a surface 55-F2 of a substrate 51-F2 according to known techniques, where the uppermost trace structure 80-F2 is connected to elongated section 102 of spring structure 100-F2 by a via structure 82-F2 that extends through insulating layer 90. FIG. 8(C) shows a third possible arrangement in which a trace structure 80-F3 is formed on a lower surface 57-F3 of a substrate 51-F3, and is connected to elongated section 102 of spring structure 100-F3 by a via structure 82-F3 that extends through substrate 51-F3. The arrangements shown in FIGS. 8(B) to 8(C) provide structures in which no extra space needed for trace metal, and hence a very high spring density is possible. The embodiments shown in FIGS. 8(A) to 8(C) are intended to be exemplary, and are not intended to limit the appended claims unless otherwise specified.

According to another aspect of the present invention, the base area of the spring structures are formed with widths that are substantially greater than the widths of the cantilever sections, and in some instances may be greater than the width of the elongated plating section. An advantage to wide base sections is that spring structures may be fabricated using a highly efficient fabrication process that obviates the need for masking the base section during release (that is, because the base is substantially wider than the cantilevered section, the base remains securely attached to the substrate during the release process). This also allows the use of lithography masks that are designed in such a way that no extra mask is needed for spring cementation (i.e., post release plating). One such efficient process flow is described below with reference to FIGS. 9(A) to 9(I).

Figure 9A:
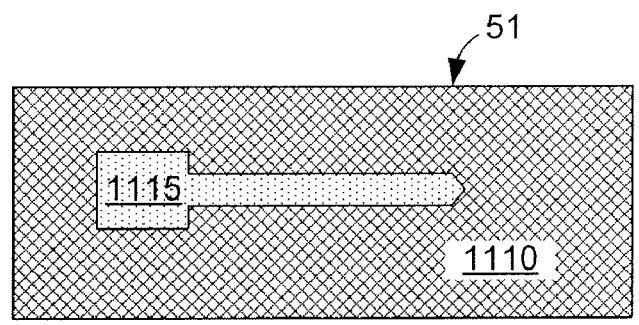
FIGS. 9(A), 9(B), 9(C), 9(D), 9(E), 9(F), 9(G), 9(H) and 9(I) are top views showing fabrication steps associated with the production of a spring structure according to another embodiment of the present invention.
Figure 9B:
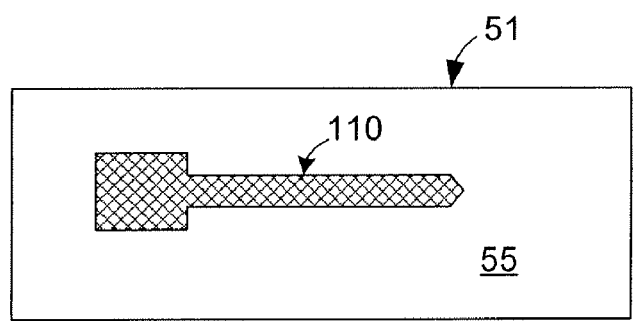
Figure 9C:
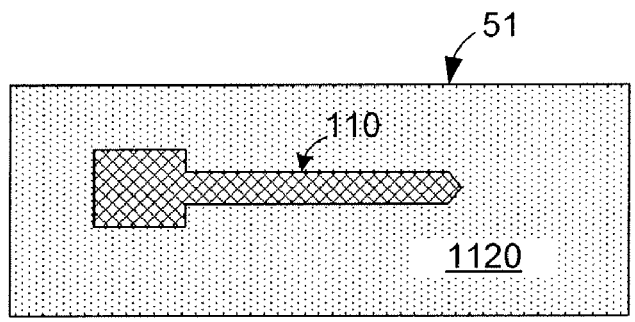
Figure 9D:
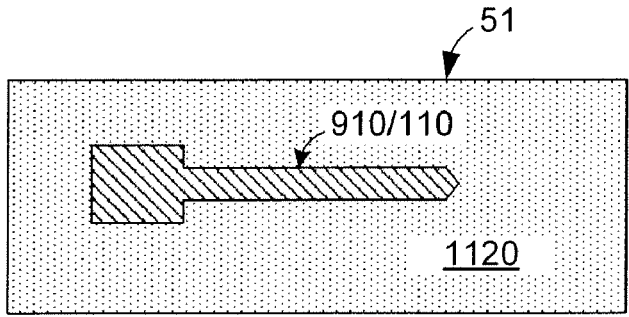
Figure 9E:
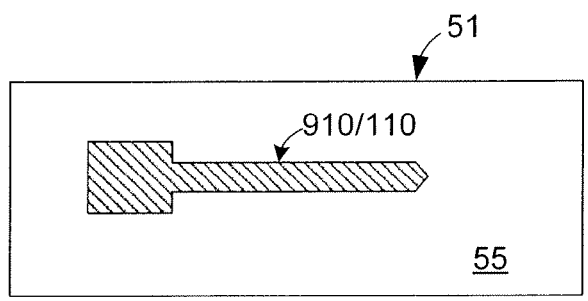
Figure 9F:
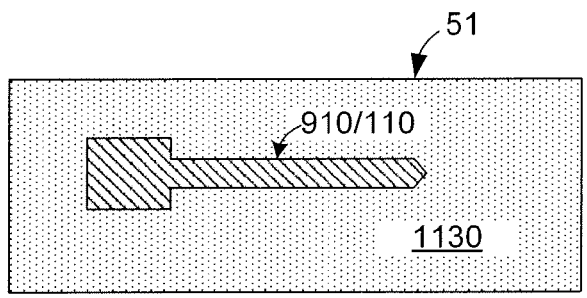
Figure 9G:
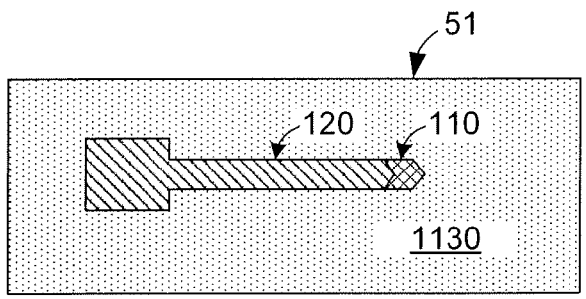
Figure 9H:
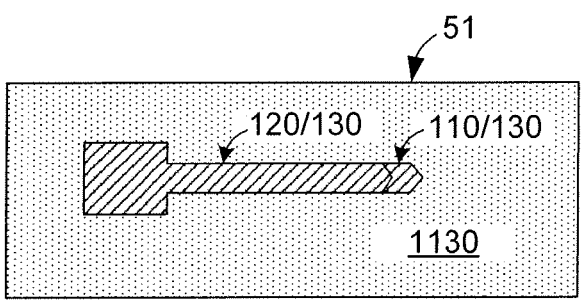
Figure 9I:
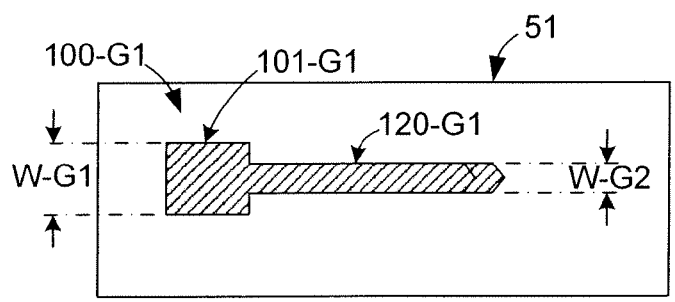

Referring to FIG. 9(A), a first mask is used to form a resist island 1115 on a layer 1110 of cementation material. The exposed cementation material is then removed (e.g., etched) to expose upper surface 55 of substrate 51, and then the resist island is removed to expose cementation layer 110 (FIG. 9(B)). FIG. 9(C) depicts the formation of a resist layer 1120 around cementation layer 110, and this mask is used to pattern the self-bending spring metal 910 over cementation layer 110 (FIG. 9(D)). As shown in FIG. 9(E), resist layer 1120 and any self-bending material formed thereon is then removed using known lift-off techniques, and then another mask 1130 is formed around the layered stack formed by cementation layer 110 and self-bending spring material island 910 (FIG. 9(F)). The self-bending spring material island is then released to form spring finger 120 (FIG. 9(G)), and then plating structure 130 is formed over spring finger 120 and the exposed portion of cementation layer 110 (FIG. 9(H)). Finally, the release/plating mask is removed (FIG. 9(I)) to complete the fabrication of spring structure 100-G1. Note that by forming base section 101-G1 with a width W-G1 that is substantially greater than the width W-G2 of cantilever section 120-G1, base section 101-G1 remains secured to substrate 51 during the release process.

Figure 10:
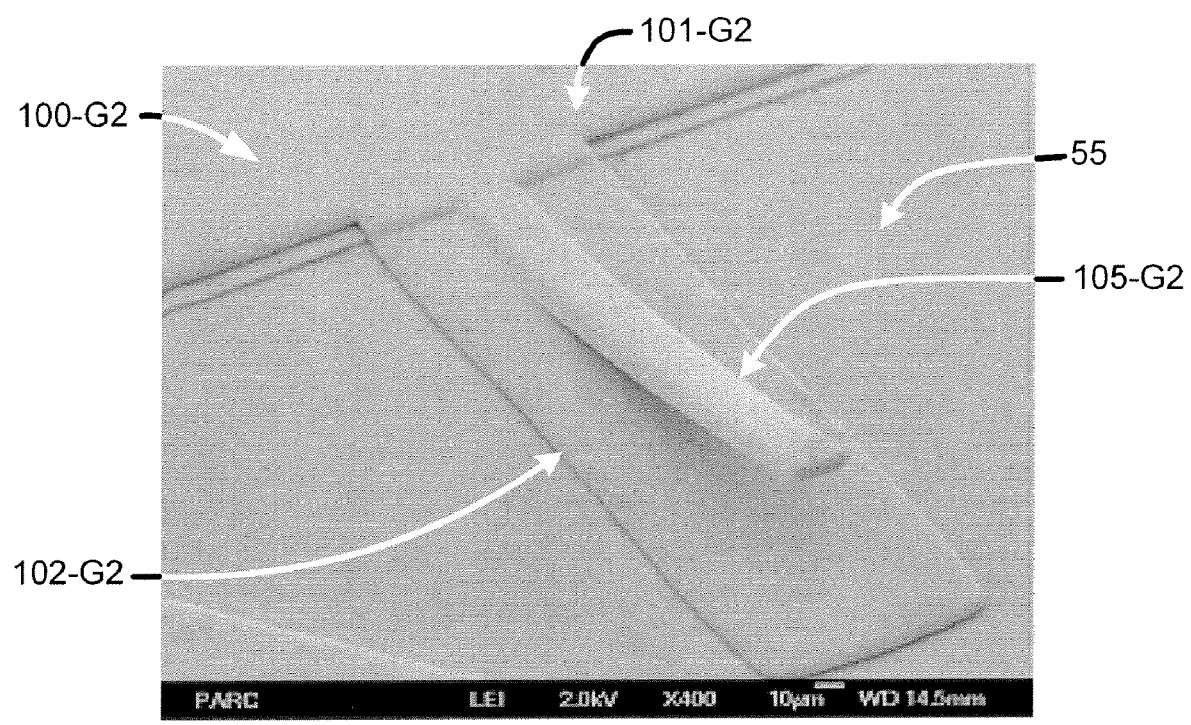
FIG. 10 is an enlarged photograph showing an actual spring structure produced in accordance with an embodiment of the present invention.

FIG. 10 is an enlarged photograph showing a spring structure 100-G2 formed in accordance with the method described above with reference to FIGS. 9(A) to 9(I). Note that base section 101-G2 is substantially wider than both elongated section 102-G2 and cantilevered section 105-G2.

Several additional alternative embodiments and applications of the present invention are described below.

According to an alternative embodiment, the cementation (plating) process is used in combination with self-releasing springs and spring encapsulation. In case of self-releasing springs that utilize selective delamination (mentioned above), the self-release area can also serve as spring cementation area. For encapsulated springs, which utilize an encapsulation layer to isolate the spring structure during release etch, spring cementation can be implemented as for common springs.

Figure 11A:
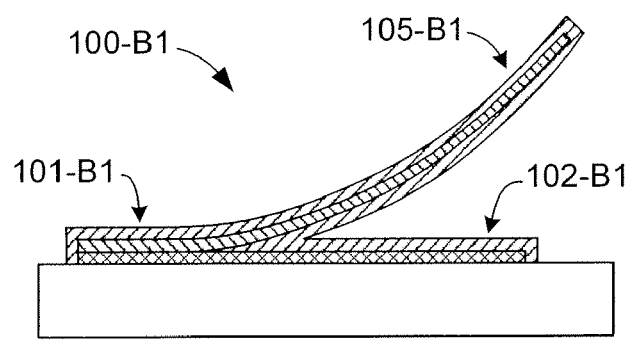
FIGS. 11(A), 11(B), 11(C), 11(D) and 11(E) are cross-sectional side views showing fabrication steps associated with the production of a spring structure according to another embodiment of the present invention.
Figure 11B:
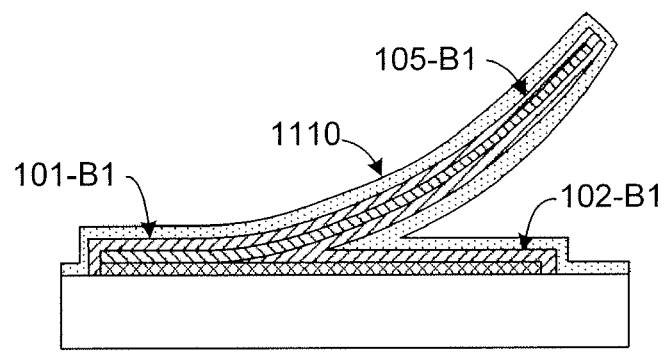
Figure 11C:
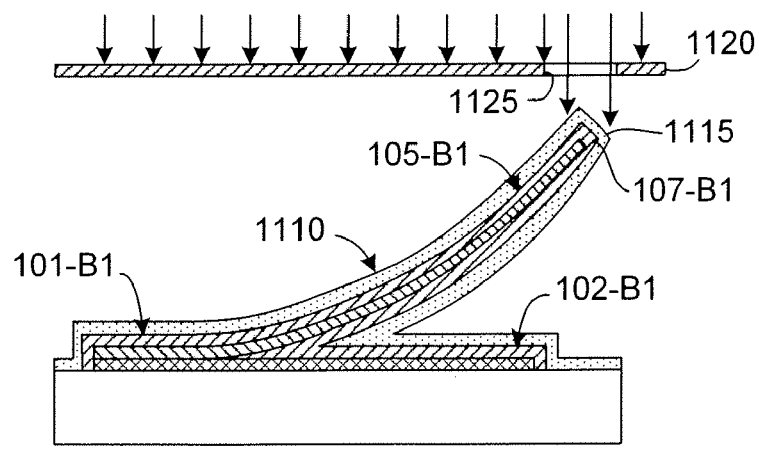
Figure 11D:
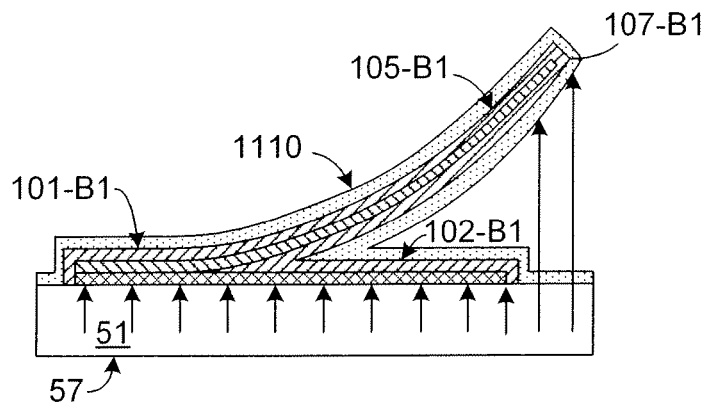
Figure 11E:
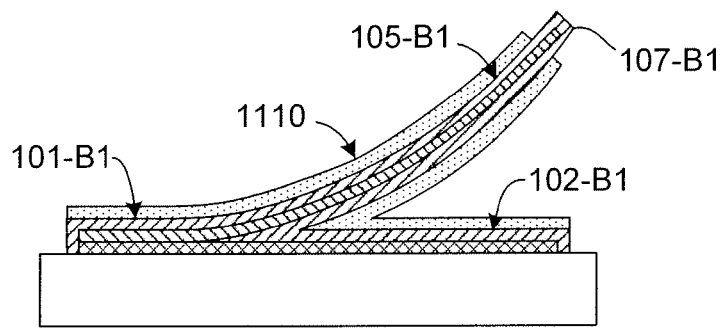

FIGS. 11(A) to 11(E) depict another alternative embodiment that uses the elongated section and back-side exposure to pattern both sides of the spring tip. Patterning the spring tip on both sides is commonly difficult to do but it is very interesting for certain applications (e.g. solder stop for interconnect, selective tip coating for bio-applications). Referring to FIG. 11(A), the present embodiment begins using spring structure 100-B1, which is described above with reference to FIG. 5(A), where cantilevered section 105-B1 extends further from base 101-121 than elongated section 102-B1. A resist coating 1110 is deposited over base section 101-121, elongated section 102-B1 and cantilevered section 105-B1 according to known techniques (FIG. 11(B)). Next, a top side shadow mask 1120 defining a window 1115 is used to expose the upper side of tip 107-B1 of cantilevered section 105-B1 (FIG. 11(C)), and then base section 101-B1 and elongated section 102-B1 are utilized as a backside mask (i.e., to block beams passed through lower surface 57 of substrate 51) to expose the lower surface of tip 107-B1 (FIG. 11(D)). In this way, tip 107-B1 can be patterned on both sides, and resist material 1110 can be selectively removed just from tip 107-B1 by etching (as indicated in FIG. 11(E)) and/or material can be deposited onto tip 107-B1 using known techniques (not shown).

Figure 12:
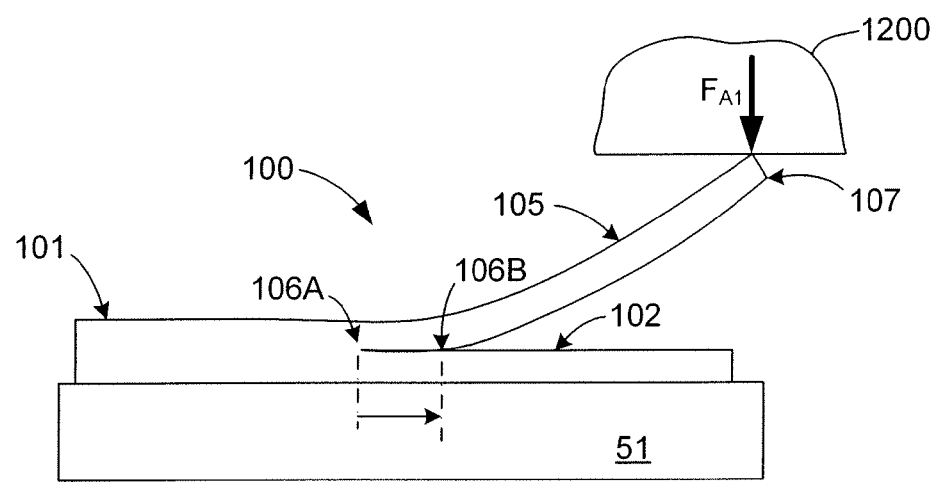
FIG. 12 is a side view showing a compressed spring structure formed in accordance with the present invention.

As set forth by the specific embodiments described above, the present invention introduces an elongated "cementation" section into spring devices for increasing the strength of the spring base (anchor), and for overcoming the problem of resist-edge plating and spontaneous metal deposition under the spring. In addition, as indicated in FIG. 12, elongated section 102 improves conductivity of the compressed spring structure 100 by increasing the total metal volume, and/or by decreasing the length of the electrical path between tip 107 and base 101 due to the contact between the flattened portion of cantilevered section 105 and elongated section 102. That is, when an object 1200 (e.g., an integrated circuit device-under-test) presses downward on tip 107, cantilever section 105 is flattened (bent toward substrate 51), which causes the effective junction point to move from initial point 106A to a second point 1061, thereby reducing the distance signals are required to pass along cantilever section 105. Note that this feature is especially attractive for relatively thin springs, and further facilitates the use of under-spring trace patterns, via structures and through-substrate interconnects positioned directly under the spring, as described above.

Although the present invention has been described with respect to certain specific embodiments, it will be clear to those skilled in the art that the inventive features of the present invention are applicable to other embodiments as well, all of which are intended to fall within the scope of the present invention. For example, although the present invention is specifically directed to plating formed on spring metal structures, plating may also be formed on non-metal spring structures (e.g., using a bilayer of oxide and silicon or Ga—As covered by a metal seed layer) using, for example, electroless plating techniques. Moreover, although the present invention describes spring structures that bend away from an underlying substrate, the present invention may also be utilized in spring structures in which the tensile/compressive stress gradient is reversed, causing the released spring structure to bend toward the substrate (e.g., into a trench formed in the substrate). FIG. 13(A) shows a spring structure 100-13A including a spring finger 120-13A having a negative gradient (for example low tensile stress on top, high tensile stress on bottom), such that free portion 125-13A curves down when released. In this case, a portion of substrate 51 is removed so that the spring is allowed to curl down. FIG. 13(B) shows a structure 100-13B according to an embodiment of the invention which includes an essentially identical spring finger 120-13B as that shown in FIG. 13(A), but this case shows the substrate 51 not removed from under the released spring so a middle section of free portion 125-13B of spring finger 120-13B pops up, but tip 128-13B stays down. The main advantage of spring structure 100-13B over spring structure 100-13A is that spring structure 100-13B can be contacted from the side, not just the top. A force from a sliding metal pad from the right (tip side) will compress the spring and make a good electrical contact. This is especially important for connector applications. FIG. 13(C) shows a spring structure 100-13C according to another embodiment of the present invention that includes a base section 101-13C and a cantilever section 105-13C similar to the structure shown in FIG. 13(B), but also includes an elongated section 102-13C extending under cantilever section 105-13C in such a way that it strengthens junction point 106-13C of cantilever section 105-13C. Junction point 106-13C needs to be strong and of controlled thicknesses so that spring structure 100-13C can operate as designed for reasons similar to those described above. As indicated by the dashed line, when cantilevered section 105-13C is compressed as shown by a force F, tip 107-13C slides along the substrate surface to the right. With a well-designed anchor this springs would have a large compliance range. FIG. 13(D) shows a spring structure 100-13D that is similar to structure 100-13C, but plated elongated section 102-13D located under cantilever section 105-13D extends beyond tip 107-13D. Elongated section 102-13D plates to tip 107-13D and secures it so tip 107-13D doesn't slide when spring structure 100-13D is compressed (as indicated by dashed line). Spring structure 100-13D would sustain very high forces F because it is doubly clamped, but would have a smaller compliance range than spring structure 100-13C.

Further, although the present invention is described with reference to spring structures having in-plane tips, the present invention may also be utilized in spring structures having out-of-plane tip structures.

The invention claimed is:

1. A spring structure formed on a substrate having a first surface, the spring structure comprising:
    a base section attached to the first surface; and
    a curved cantilever section having fixed end attached to the base section, a middle section disposed a first distance away from the first surface of the substrate, and a tip end disposed in slidable contact with the first surface of the substrate,
    wherein both the base section and the curved cantilever section comprise one of a stress-engineered spring material structure, and a bimorph/bimetallic structure.

2. A spring structure formed on a substrate having a first surface, the spring structure comprising:
    a base section attached to the first surface;
    a curved cantilever section having fixed end attached to the base section, a middle section disposed a first distance away from the first surface of the substrate, and a tip end disposed in slidable contact with the first surface of the substrate; and a plated material disposed on the base section and the curved cantilever section.

3. The spring structure according to claim 2, further comprising
an elongated section attached to the first surface and extending from the fixed end under the middle section of the curved cantilever section such that an air gap is defined between the middle section and the elongated section.

4. The spring structure according to claim 3, wherein the tip end of the curved cantilever section abuts the elongated section.

5. A spring structure formed on a substrate having a first surface, the spring structure comprising:
a base section attached to the first surface;
an elongated section having a first end attached to the base section, the elongated section extending away from the base section in a direction parallel to the first surface; and
a curved cantilever section having a fixed end attached to the base section, a curved middle section extending away from the substrate and then back down toward the substrate, and a second end disposed at an end of the middle section,
wherein the elongated section is located between the middle section of the curved cantilever section and the first surface of the substrate, and between the fixed and second ends of the curved cantilever section,
wherein an air gap is defined between the elongated section and the curved middle section of the curved cantilever section, and
wherein the spring structure comprises one of a stress-engineered spring material structure, and a bimorph/bimetallic structure.

6. The spring structure according to claim 5, further comprising a plated metal material disposed on the base section and the curved cantilever section.

7. The spring structure according to claim 5, wherein the elongated section extends from the fixed end to the second end of the curved cantilever section, and the second end of the curved cantilever section is attached to the elongated section.

8. A spring structure formed on a substrate having a planar surface, the spring structure comprising:
a spring finger having an anchor portion secured to the planar surface, and a curved free portion having a first section extending from the anchor portion away from the planar surface, and a second section extending from the first section toward the substrate and having a tip; and
a plated metal structure including a base plating portion formed on the anchor portion of the spring finger, and an elongated plating portion extending from the base plating portion in a direction substantially parallel to the first surface and positioned such that the elongated plating portion is located between the curved free portion of the spring finger and the planar surface of the substrate and the tip of the spring finger,
wherein an air gap is defined between the elongated section and the curved free portion of the spring finger, and
wherein the spring finger comprises one of a stress-engineered spring material structure, and a bimorph/bimetallic structure.

9. The spring structure according to claim 8, wherein the tip of the spring finger abuts at least one of the elongated plating portion and the planar surface of the substrate.

10. The spring structure according to claim 8, wherein the tip of the spring finger is connected to the elongated plating portion.

11. The spring structure according to claim 8, wherein the elongated section extends from the fixed end to the second end of the curved cantilever section, and the second end of the cured cantilever section is attached to the elongated section.

12. The spring structure according to claim 11, wherein the spring structure further comprises a cementation layer having a first end portion located in the base section, and a second end portion located in the elongated section.

13. The spring structure according to claim 12, wherein the cementation layer comprises at least one of gold (Au), nickel (Ni), and copper (Cu), and the plated metal structure comprises at least one of copper (Cu), nickel (Ni), rhodium (Rh), palladium (Pd), cobalt (Co), chromium (Cr), silver (Ag), zinc (Zn), iron (Fe), cadmium (Cd), gold (Au), nickel-phosphor (NiP), and nickel-boron (NiB).

14. A spring structure formed on a substrate having a planar surface, the spring structure comprising:
a spring finger having a first anchor portion secured to the planar surface, and a curved free portion having a first section extending from the anchor portion away from the planar surface, and a second section extending from the first section to the substrate to form a second anchor portion that is secured to the planar surface of the substrate; and
a plated metal structure including a base plating portion formed on the anchor portion of the spring finger, and an elongated plating portion extending from the base plating portion in a direction substantially parallel to the first surface and positioned such that the elongated plating portion is located between the curved free portion of the spring finger and the planar surface of the substrate, wherein the elongated plating portion is connected to the second anchor portion of the spring finger,
wherein the spring finger comprises one of a stress-engineered spring material structure, and a bimorph/bimetallic structure.

* * * * *